(12) United States Patent
Sato

(10) Patent No.: US 10,586,898 B2
(45) Date of Patent: Mar. 10, 2020

(54) METHOD OF MANUFACTURING LIGHT EMITTING DEVICE

(71) Applicant: NICHIA CORPORATION, Anan-shi, Tokushima (JP)

(72) Inventor: Yoshiki Sato, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/146,521

(22) Filed: Sep. 28, 2018

(65) Prior Publication Data

US 2019/0103534 A1    Apr. 4, 2019

(30) Foreign Application Priority Data

Sep. 29, 2017 (JP) .................................. 2017-191474

(51) Int. Cl.
*H01L 33/56* (2010.01)
*H01L 33/50* (2010.01)
(Continued)

(52) U.S. Cl.
CPC .............. *H01L 33/56* (2013.01); *H01L 21/78* (2013.01); *H01L 23/544* (2013.01);
(Continued)

(58) Field of Classification Search
CPC .............. H01L 33/52–56; H01L 33/60; H01L 33/50–502; H01L 33/405; H01L 33/402;
(Continued)

(56) References Cited

U.S. PATENT DOCUMENTS

2005/0282360 A1* 12/2005 Kida ...................... H01L 21/78
                                                              438/462
2006/0027809 A1*  2/2006 Ogawa .................. H01L 21/268
                                                              257/66
(Continued)

FOREIGN PATENT DOCUMENTS

JP          2009071012 A     4/2009
JP          2012244086 A    12/2012
(Continued)

*Primary Examiner* — Zandra V Smith
*Assistant Examiner* — Jeremy J Joy
(74) *Attorney, Agent, or Firm* — Hunton Andrews Kurth LLP

(57) ABSTRACT

A method of manufacturing a light emitting device in which a plurality of light emitting devices are formed collectively and then separated into individual light emitting devices, wherein each light emitting device includes a light emitting element, the method including, a base member providing step of providing a base member including: a wiring electrode to be connected to the light emitting elements, and an alignment mark, wherein the wiring electrode and the alignment mark are disposed on an upper surface of the base member; a mounting step of mounting each of the light emitting elements at a predetermined position; an alignment mark covering step of covering the alignment mark with a light-transmissive resin; a reflective resin forming step of forming a reflective resin surrounding the light emitting element so as to expose at least a part of a surface of the light-transmissive resin, the reflective resin reflecting light from the light emitting element; and a cutting step of recognizing the alignment mark through the exposed surface of the light-transmissive resin, and cutting the reflective resin and the base member with reference to the alignment mark to perform singulation into individual light emitting devices.

13 Claims, 7 Drawing Sheets

(51) Int. Cl.
*H01L 33/48* (2010.01)
*H01L 33/00* (2010.01)
*H01L 33/60* (2010.01)
*H01L 33/62* (2010.01)
*H01L 21/78* (2006.01)
*H01L 23/544* (2006.01)

(52) U.S. Cl.
CPC ........ *H01L 33/0095* (2013.01); *H01L 33/507* (2013.01); *H01L 33/62* (2013.01); *H01L 33/486* (2013.01); *H01L 33/502* (2013.01); *H01L 33/60* (2013.01); *H01L 2933/0033* (2013.01); *H01L 2933/0041* (2013.01); *H01L 2933/0058* (2013.01); *H01L 2933/0066* (2013.01)

(58) Field of Classification Search
CPC ................. H01L 33/486; H01L 23/544; H01L 2223/54426
See application file for complete search history.

(56) References Cited

U.S. PATENT DOCUMENTS

| | | | |
|---|---|---|---|
| 2009/0200570 A1* | 8/2009 | Mori | H01L 33/642 257/99 |
| 2009/0269704 A1* | 10/2009 | Hodono | G02B 6/13 430/319 |
| 2010/0129036 A1* | 5/2010 | Hodono | B32B 38/1841 385/88 |
| 2011/0291154 A1* | 12/2011 | Noichi | H01L 33/486 257/99 |
| 2016/0274317 A1* | 9/2016 | Tsujita | G02B 6/4214 |
| 2017/0110635 A1* | 4/2017 | Ito | H01L 33/507 |
| 2017/0148700 A1* | 5/2017 | Narita | H01L 21/78 |
| 2017/0154880 A1* | 6/2017 | Ozeki | H01L 33/60 |
| 2017/0170127 A1* | 6/2017 | Choi | H01L 23/544 |
| 2017/0307833 A1* | 10/2017 | Tsujita | G02B 6/122 |

FOREIGN PATENT DOCUMENTS

| | | |
|---|---|---|
| JP | 2017076719 A | 4/2017 |
| JP | 2017108092 A | 6/2017 |

* cited by examiner

Fig. 3
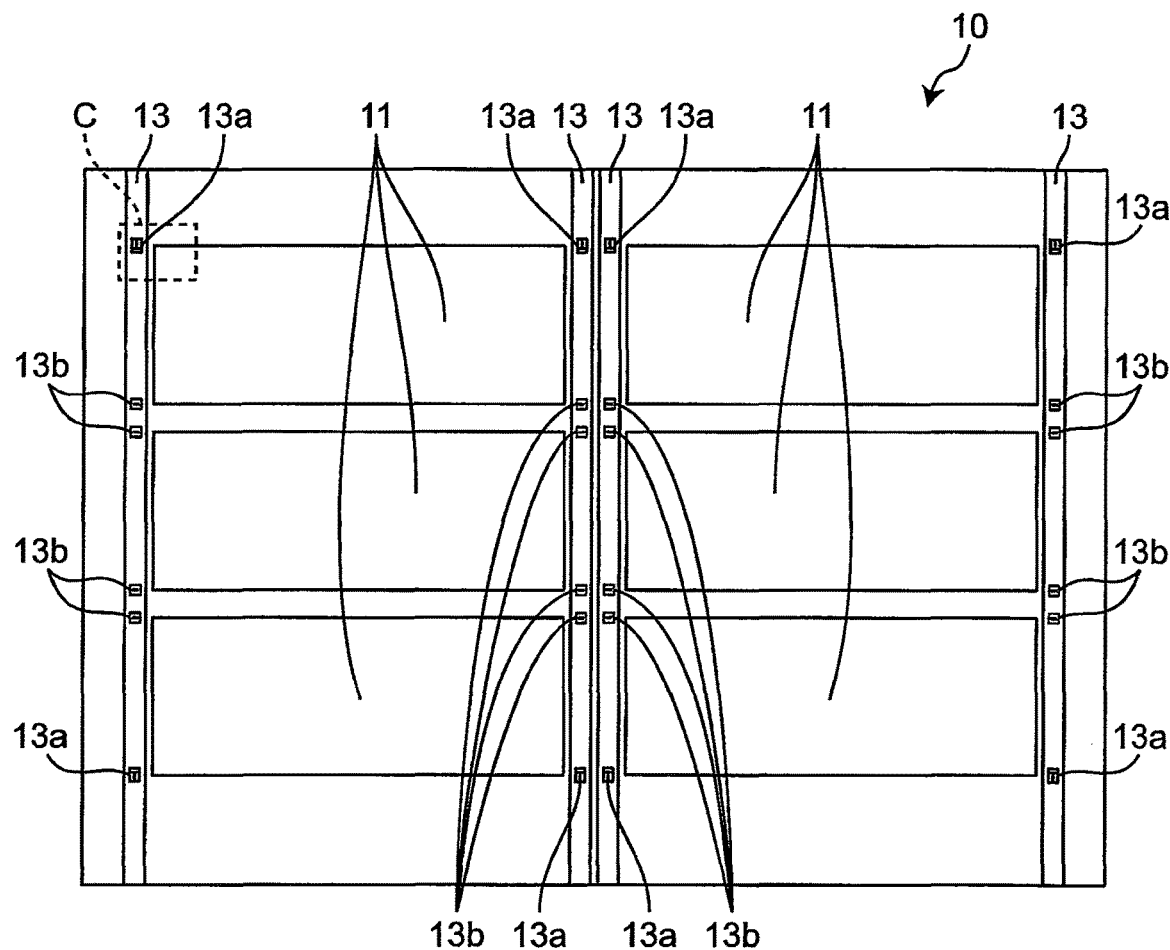
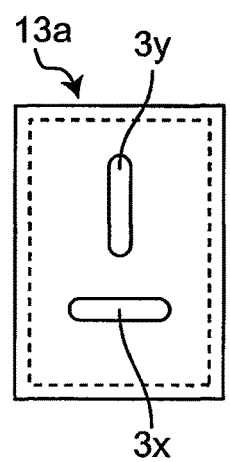
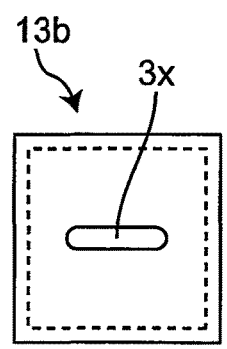
FIG. 4 (a)    FIG. 4 (b)

METHOD OF MANUFACTURING LIGHT EMITTING DEVICE

CROSS-REFERENCE TO RELATED PATENT APPLICATION

This application claims priority under 35 U.S.C. § 119 to Japanese Patent Application No. 2017-191474, filed Sep. 29, 2017. The entire disclosure of Japanese Patent Application No. 2017-191474 is incorporated by reference herein.

BACKGROUND

1. Technical Field

The present disclosure relates to a method of manufacturing a light emitting device.

2. Description of Related Art

In recent years, light emitting devices including light emitting elements, such as light emitting diodes, have been used in various applications and market demand requires the provision of light emitting elements at lower costs. For meeting such demand, for example, JP 2017-076719 A describes that a plurality of light emitting elements are mounted on a base member, a plurality of the mounted light emitting elements are covered with a resin sheet, the resin sheet is softened to fill gaps between the light emitting elements, and the base member and the resin sheet are cut at portions between the light emitting elements, to manufacture light emitting devices.

In addition, market and technological demands require that lower cost light emitting devices have a reduced size and a reduced weight. Also, in applications where a plurality of light emitting elements are arranged on a base member and cutting is required to manufacture light emitting devices, such cutting must be performed accurately. Generally, the cutting positions are set with reference to an alignment mark provided on the base member, and accordingly it is necessary to accurately recognize the position of an alignment mark at the time the cutting is performed.

SUMMARY

One object of the present invention is to provide a method of manufacturing a light emitting device, having a reduced size, reduced weight, reduced cost, and with which the position of an alignment mark can be accurately recognized at the time of cutting to allow cutting into individual light emitting devices.

A method of manufacturing a light emitting device in which a plurality of light emitting devices each including a light emitting element is formed collectively, and then separated into individual light emitting devices, the method including, a base member providing step of providing a base member including: a wiring electrode to be connected to the light emitting elements, and an alignment mark, the wiring electrode and the alignment mark disposed on an upper surface of the base member; a mounting step of mounting each of the light emitting elements at a predetermined position; an alignment mark covering step of covering the alignment mark with a light-transmissive resin; a reflective resin forming step of forming a reflective resin surrounding the light emitting element so as to expose at least a part of a surface of the light-transmissive resin, the reflective resin reflecting light from the light emitting element; and a cutting step of recognizing the alignment mark through the exposed surface of the light-transmissive resin, and cutting the reflective resin and the base member with reference to the alignment mark to perform singulation into individual light emitting devices.

The method of manufacturing a light emitting device according to one embodiment of the present invention with configurations as described above, the position of an alignment mark can be accurately recognized at the time of cutting to perform cutting into individual light emitting devices. Light emitting devices according to embodiments of the present invention can have a reduced size and reduced weight, and can be provided at a lower cost.

BRIEF DESCRIPTION OF THE DRAWINGS

FIG. 3 is a schematic plan view showing an overall configuration of a base member used in a method of manufacturing a light emitting device according to the first embodiment.

FIG. 4A is a schematic plan view of a unit alignment-mark formation region and FIG. 4B is a schematic plan view of a unit alignment-mark formation region.

DETAILED DESCRIPTION OF EMBODIMENTS

Figure 1:
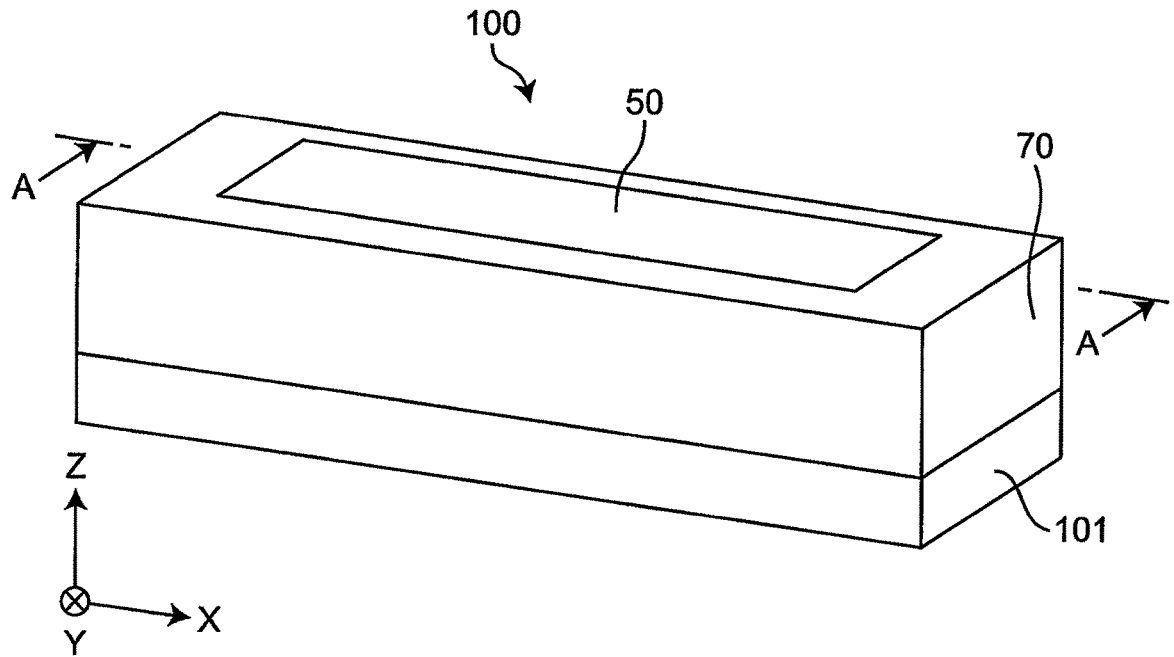
FIG. 1 is a perspective view of a light emitting device manufactured using a method of manufacturing a light emitting device according to a first embodiment.
Figure 2:
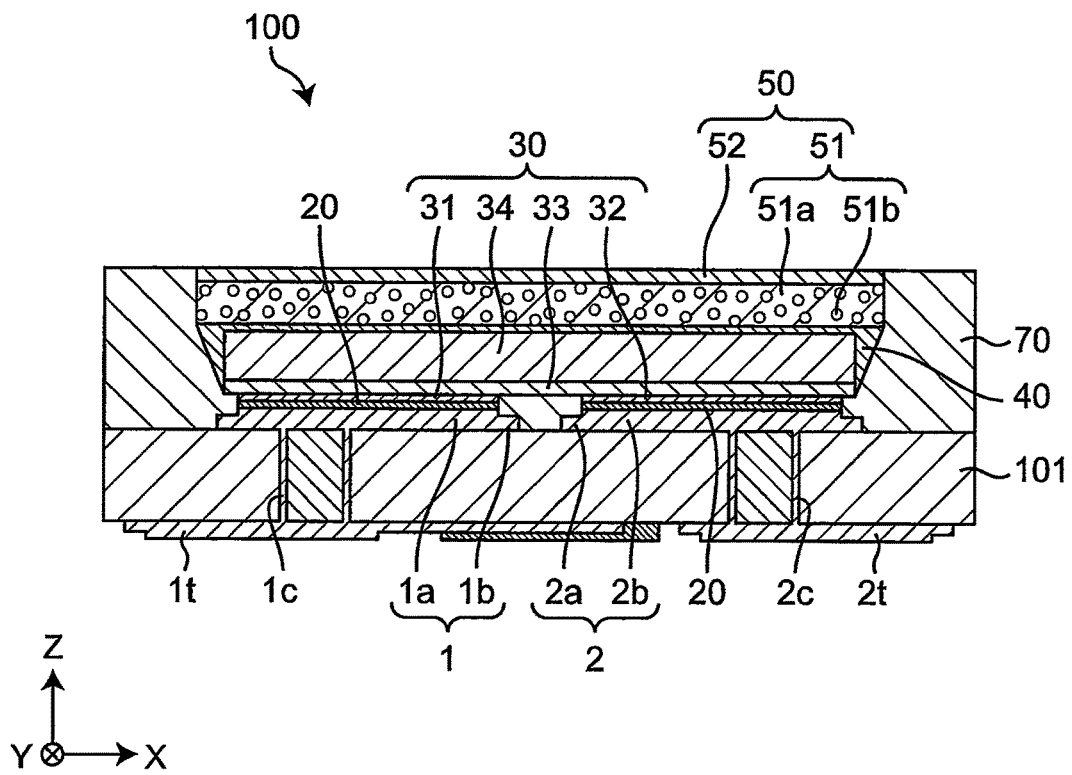
FIG. 2 is a schematic cross-sectional view taken along line A-A in FIG. 1.

FIG. 1 is a perspective view of a light emitting device 100 manufactured using a method of manufacturing a light emitting device according to a first embodiment. FIG. 2 is a schematic cross-sectional view taken along line A-A in FIG. 1.

The light emitting device 100 includes a base member (hereinafter, may be referred to as a "singulated base member" because it is a base member after singulation) 101, a light emitting element 30, a light-transmissive member 50 and a reflective resin 70. The singulated base member 101 has a first land electrode 1 and a second land electrode 2 that are disposed on an upper surface of the singulated member 101, and a first terminal electrode 1t and a second terminal electrode 2t that are disposed on a lower surface of the singulated member 101. The first land electrode 1 includes a first lower electrode 1b, and a first projection 1a on the first lower electrode 1b. The second land electrode 2 includes a second lower electrode 2b, a second projection 2a on the second lower electrode 2b. In addition, the first land electrode 1 is connected to the first terminal electrode 1t by a connection electrode 1c disposed on a lateral surface that defines a through-hole extending through the singulated base member 101 and provided directly below the first land electrode 1. The second land electrode 2 is connected to the second terminal electrode 2t by a connection electrode 2c disposed on a lateral surface of a through-hole extending through the singulated base member 101 and provided directly below the second land electrode 2. Each of the connection electrodes 1c and 2c is disposed on an inner surface defining a respective one of the through-holes. In each of the through-holes, for example, a filler such as an epoxy resin is disposed inward of a respective one of the connection electrodes 1c and 2c.

The light emitting element 30 includes, for example, an element substrate 34, and a semiconductor layered structure 33 disposed on one principal surface of the element substrate. In addition, the light emitting element 30 includes a p-side electrode 31 and an n-side electrode 32 disposed on a surface of the semiconductor layered structure 33, i.e., at a same surface side, and is flip-chip-mounted in such a manner that the p-side electrode 31 is connected to the first projection 1a through one of electrically conductive bonding members 20, and the n-side electrode 32 is connected to the second projection 2a through the other of the electrically conductive bonding members 20. The p-side electrode 31 and the n-side electrode 32 are electrically separated from each other, the p-side electrode 31 is in contact with a p-type semiconductor layer of the semiconductor layered structure 33, and the n-side electrode 32 is in contact with an n-type semiconductor layer of the semiconductor layered structure 33. Illustrations of these configurations are simplified in FIG. 2. Further, in the light emitting element 30, a surface opposite to a surface on which the p-side electrode 31 and the n-side electrode 32 are formed is a light emitting surface. In addition, the light emitting element 30 is a light emitting diode chip having a greater length in an X direction and a smaller length in a Y direction.

The light-transmissive member 50 is a rectangular solid-shaped small piece having a greater length in the X direction and a smaller length in the Y direction, and for example, a size of the light-transmissive member 50 is a little larger than that of the light emitting element 30, and is bonded to the light emitting surface of the light emitting element 30 via a light guide member 40 disposed therebetween. The light-transmissive member 50 includes, for example, a first light-transmissive member 51 containing a wavelength conversion substance 51b in a base material 51a made of a resin, and a second light-transmissive member 52 containing substantially no wavelength conversion substance. For example, with the light-transmissive member 50 including the second light-transmissive member 52 containing substantially no wavelength conversion substance at a light emitting surface side of the light emitting device, a portion of a reflective resin can be removed without grinding the first light-transmissive member 51 containing the wavelength conversion substance 51b when, for example, a portion of the reflective resin on the light-transmissive member 50 is removed in the manufacturing method which will be described below. Accordingly, a variation in amount of the wavelength conversion substance 51b present on the light emitting element 30 can be reduced, so that variation in color of light emitted from the light emitting device can be reduced.

The reflective resin 70 is, for example, a reflective member containing a white pigment in a base material made of a resin, and covers lateral surfaces of the light emitting element 30, lateral surfaces of the light guide member 40 and lateral surfaces of the light-transmissive member 50 on the singulated base member 101. The reflective resin 70 surrounds the lateral surfaces of the light emitting element 30, and the lateral surfaces of the light-transmissive member 50, etc., over the whole periphery thereof. In addition, the upper surface of the light-transmissive member 50 and the upper surface of the reflective resin 70 are substantially in the same plane.

In the light emitting device 100 having configurations as described above, light laterally emitted from the light emitting element 30 and the light-transmissive member 50 is reflected by the reflective resin 70 to be emitted upward (i.e., frontward), so that light extraction efficiency in an upward direction (i.e., in a frontward direction) can be enhanced. In the light emitting device 100 having configurations as described above, it is required to form the reflective resin 70 with a certain thickness or more so that the amount of light transmitted through the reflective resin 70 is reduced to increase the amount of light reflected by the reflective resin 70. When light emitting devices 100 are formed collectively on a base member, and the reflective resin 70 is cut between light emitting elements 30 to manufacture individual light emitting devices 100, with a poor accuracy of cutting position of the light emitting element 30 and the light-transmissive member 50 with respect to the mounting position, the reflective resin 70 needs to be formed to have an excessively large thickness with consideration on a variation in accuracy of cutting position, and thus reduction in size is restricted. However, with the method of manufacturing a light emitting device according to a first embodiment as described below, the position of alignment marks 3 can be accurately recognized, so that the cutting position can be accurately set with respect to the mounting position of the light emitting element 30. Accordingly, it is not necessary to form the reflective resin 70 with an excessively large thickness, and thus a small light emitting device can be manufactured.

Hereinafter, the method of manufacturing the light emitting device 100 according to the first embodiment will be described with reference to the drawings.

Figure 5:
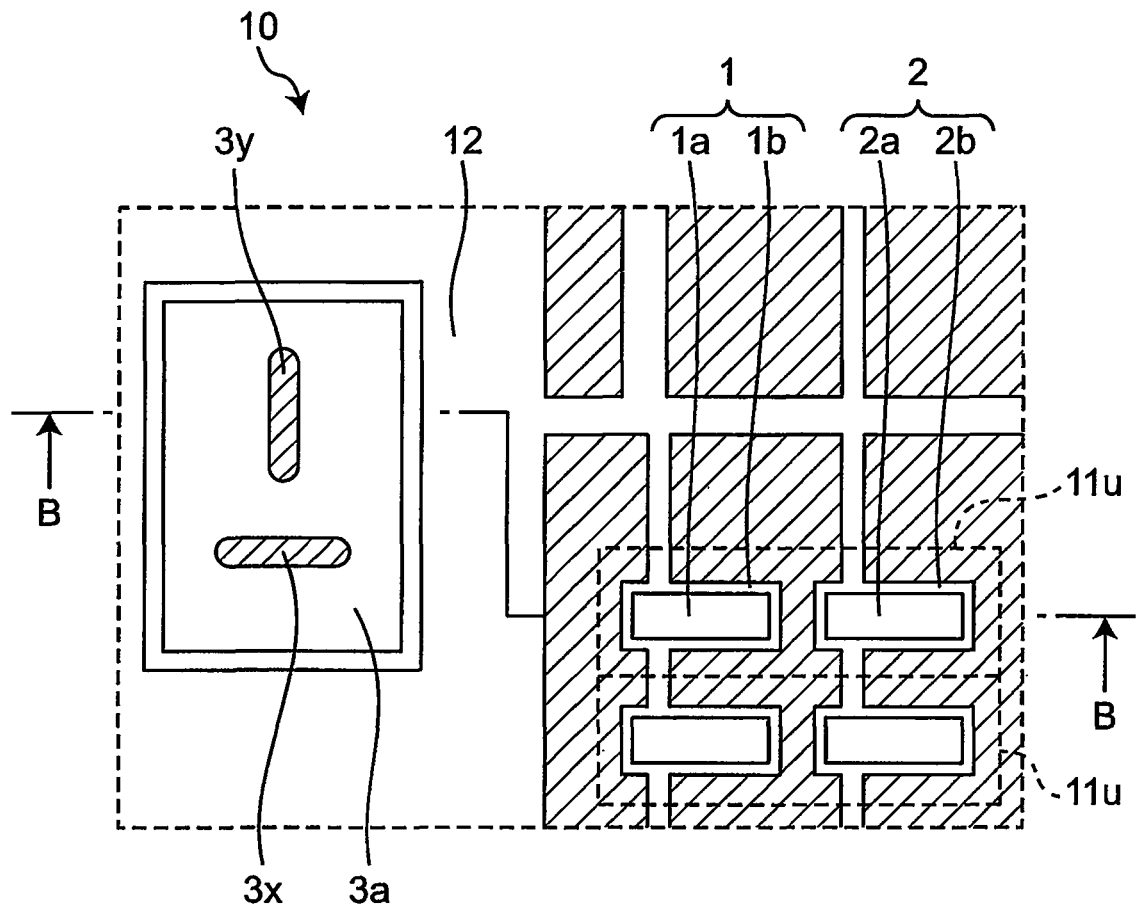
FIG. 5 is a schematic enlarged plan view of region C in FIG. 3.

FIG. 3 is a schematic plan view showing an overall configuration of a base member 10 to be used in the method of manufacturing a light emitting device 100 according to the first embodiment. FIG. 5 is a schematic enlarged plan view showing a region C, which is a portion of the base member 10, in FIG. 3.

Figure 6:
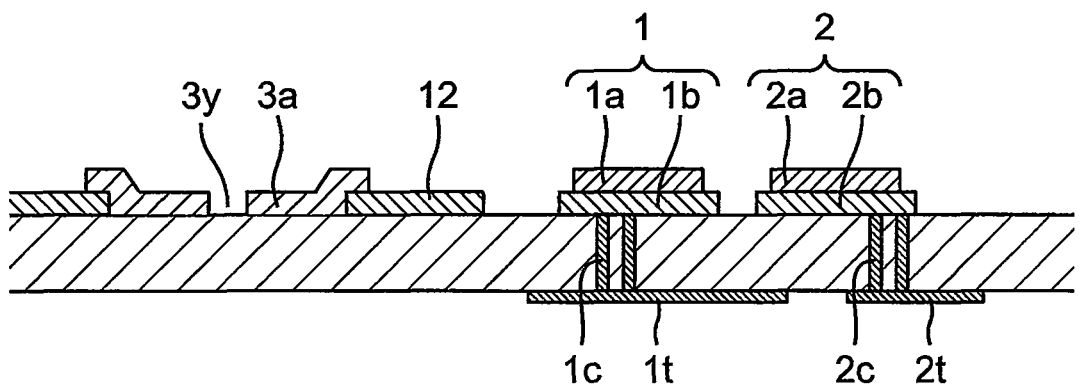
FIG. 6 is a schematic cross-sectional view taken along a line B-B in FIG. 5.

FIG. 6 is a schematic cross-sectional view taken along line B-B in FIG. 5. FIG. 4A is a plan view of a unit alignment-mark formation region 13*a*, and FIG. 4B is a plan view of a unit alignment-mark formation region 13*b*.

The method of manufacturing the light emitting device 100 according to the first embodiment is a method of manufacturing a light emitting device in which a plurality of light emitting devices each including a light emitting element is formed collectively, and then separated into individual light emitting devices. The method of manufacturing a light emitting device include providing a base member, mounting a light emitting element, covering an alignment mark, and forming a reflective resin, and performing cutting to singulate into individual light emitting devices.

Hereinafter, the steps will be described in detail.

Providing Base Member

In a step of providing the base member, the base member 10, in which a wiring electrode 12 to be connected to the light emitting element 30, and the alignment marks 3 are provided on an upper surface, are provided. The wiring electrode 12 includes the first land electrode 1, the second land electrode 2, and an electrode frame for forming the alignment marks 3 as described below.

The base member 10 includes, for example, a plurality of rectangular mounting regions 11 (i.e., six mounting regions 11 in FIG. 3), and a plurality of alignment-mark formation regions 13 provided on a straight line outside the mounting region 11 along one side of the mounting region 11 as shown in FIG. 3. A plurality of mounting regions 11 is arranged in, for example, a plurality of rows and columns.

In this specification, arrangement in an X direction are referred to as "rows", and arrangement in a Y direction are referred to as "columns".

In the example shown in FIG. 3, the mounting regions 11 are arranged in 3 rows and 2 columns. In addition, each of the mounting regions 11 includes a plurality of unit mounting regions 11*u*, each of which is provided so as to correspond to a respective one of light emitting devices 100. The unit mounting regions 11*u* are arranged in a plurality of rows and columns in each mounting region 11.

In addition, each of the alignment-mark formation regions 13 includes, for example, two unit alignment-mark formation regions 13*a* and 13*b*. The unit alignment-mark formation regions 13*a* and 13*b* are disposed in the vicinity of a corner of the mounting region 11 in the alignment-mark formation regions 13, which are provided outside of the mounting regions 11.

As shown in FIG. 4A, the unit alignment-mark formation region 13*a* includes an alignment mark 3*x* and an alignment mark 3*y* each having a longitudinal direction, and the longitudinal direction of the alignment mark 3*x* and that of the alignment mark 3*y* are different from each other. The unit alignment-mark formation region 13*b* includes the alignment mark 3*x* as shown in FIG. 4B. The longitudinal direction of the alignment mark 3*x* coincides with the X direction, and the longitudinal direction of the alignment mark 3*y* coincides with the Y direction. Specifically, the alignment mark 3*x* has a shape elongated in the X direction, with opposite long sides extending in the X direction, and semicircular short sides each connecting the ends of the long sides. The alignment mark 3*y* has a shape elongated in the Y direction, with opposite long sides extending in the Y direction, and semicircular short sides each connecting the ends of the long sides.

FIGS. 5 and 6 show alignment marks 3*x* and 3*y*, each of which is surrounded by the wiring electrode 12 and formed by a pattern having a recess whose bottom surface is an exposed surface of the base member 10. That is, the wiring electrode 12 includes electrode frames 3*a* each defines a corresponding or more of the alignment marks 3*x* and 3*y* constituted by a surface of the base member 10. In the manufacturing method according to the present embodiment, a surface of the base member 10 may be exposed at the periphery of a part of the wiring electrode 12 to form the island-shaped wiring electrode 12, with the island-shaped wiring electrode 12 forming the alignment mark 3. In any case, it is preferable that, for example, as described below, an exposure in a photolithography to form the alignment mark 3 and an exposure in a photolithography to form first and second projections defining the mounting position of the light emitting element 30 are performed at once for accurately arranging the alignment mark 3 with respect to the mounting position of the light emitting element 30. In addition, in the manufacturing method according to the present embodiment, the alignment mark and the wiring electrode 12 may be formed in different steps.

In the manner described above, one of or both the alignment marks 3*x* and 3*y* is (are) arranged outside each mounting region 11 in the vicinity of each of corners of each mounting region 11.

In each of the unit mounting regions 11*u* of the base member 10, the first land electrode 1 and the second land electrode 2 are disposed as shown in FIG. 5. Further, the first land electrode 1 includes the first lower electrode 1*b* and the first projection 1*a* disposed on the first lower electrode 1*b*, and the second land electrode 2 includes the second lower electrode 2*b* and the second projection 2*a* disposed on the second lower electrode 2*b*. Even further, as shown in FIG. 6, the first terminal electrode 1*t* and the second terminal electrode 2*t* are provided on the lower surface of the base member 10 in the unit mounting region 11*u* as shown in FIG. 6. In each unit mounting region 11*u*, the first land electrode 1 and the second land electrode 2 are connected to the first terminal electrode 1*t* and the second terminal electrode 2*t*, respectively, by a connection electrode disposed on a lateral surface defining respective one of the through-holes in the base member 10. On the base member 10, the first land electrode 1 and the second land electrode 2 are each provided as a part of the wiring electrode 12 as shown in FIG. 5. Although FIG. 5 is a schematic plan view showing a part of the upper surface of the base member 10 and is not a cross-sectional view, the exposed portion of the surface of the base member 10 is indicated by hatchings for easily understanding the shape of the continuously shaped wiring electrode 12. In FIG. 5, the portion without hatchings indicates the wiring electrode 12.

Mounting

In the step of mounting, each of the light emitting elements 30 is mounted at a predetermined position.

The step of mounting may further include placing the light-transmissive member 50 on each of the mounted light emitting elements 30 as necessary. Hereinafter, a case where the light-transmissive member 50 is placed will be described.

1. Mounting Light Emitting Element

Figure 7A:
FIG. 7A is a schematic cross-sectional view where a light emitting element is flip-chip-mounted on a base member.

In the mounting of the light emitting element, the light emitting element 30 is flip-chip-mounted on the base member 10 as shown in FIG. 7A. Specifically, a paste-like electrically conductive adhesive member 20 is applied onto each of the first projection 1*a* and the second projection 2*a*, and the light emitting element 30 is placed such that the p-side electrode 31 and the n-side electrode 32 of the light emitting element 30 face the first projection 1*a* and the second projection 2*a*, respectively. The electrically conductive bonding member 20 is heated to be melted in a reflow furnace or the like, and then cooled to be solidified. When the electrically conductive bonding member 20 is heated to be melted, the light emitting element 30 can be mounted with high accuracy with respect to the first projection 1*a* and the second projection 2*a* due to the self-alignment effect of the first projection 1*a* and the second projection 2*a*. The electrically conductive adhesive member 20 is, for example, a solder. FIG. 7A shows the light emitting element mounting step in a simplified manner, where only the first land electrode 1 is shown without showing boundary between the lower electrode 1*b* and the first projection 1*a*, and only the second land electrode 2 is shown without showing boundary between the second lower electrode 2*b* and the second projection 2*a*. In FIG. 7A, the electrically conductive bonding member 20 is not shown.

2. Bonding Light-Transmissive Member Bonding Step

Figure 7B:
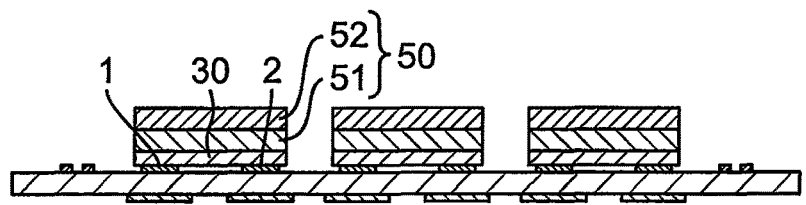
FIG. 7B is a schematic cross-sectional view where a light-transmissive member is bonded onto a light emitting element.

In the bonding of the light-transmissive member bonding, the light-transmissive member 50 is bonded onto each of the light emitting elements 30 as shown in FIG. 7B. Specifically, the light guide member 40 in a liquid form is applied onto each light emitting element 30, the light-transmissive member 50 is placed on the light guide member 40, and the light guide member 40 is cured by heating treatment. The "liquid form" in this specification encompasses a sol form and a slurry form.

The method of manufacturing according to the present embodiment may include processing to adjust the outer shape of the light-transmissive member 50 into a predetermined size after bonding the light-transmissive member 50 onto each of the light emitting elements 30. In the processing, it is preferable that using, for example, a blade dicing apparatus, a lateral surface of the light-transmissive member 50 is ground by dry grinding without spraying water. Dry grinding allows for preventing discoloration of the wavelength conversion substance by moisture. In addition, the processing can be accurately carried out with a grinding blade positioned with reference to the alignment marks 3*x* and 3*y*. In addition, cutting scraps after processing are washed off using, for example, dry ice, which allows for preventing discoloration of the wavelength conversion substance by moisture.

Covering Alignment Mark

In the covering of the alignment mark, the alignment mark is covered with a light-transmissive resin 80.

Figure 7C:
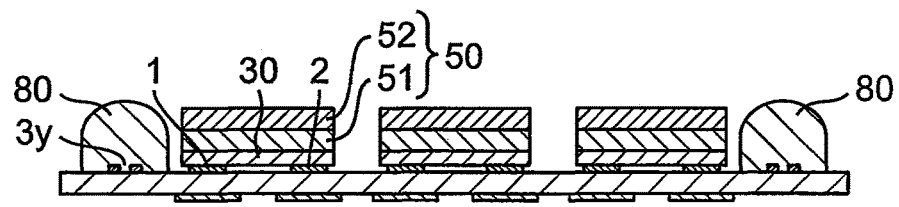
FIG. 7C is a schematic cross-sectional view where a light-transmissive resin is applied to an alignment-mark formation region and cured.

For example, a light-transmissive resin 80 is continuously applied to the alignment-mark formation region 13, and curing is performed to cover the alignment marks 3*x* and 3*y* with the light-transmissive resin 80 as shown in FIG. 7C. For the light-transmissive resin 80, for example, a silicone resin, a silicone-modified resin, an epoxy resin, a phenol resin, a polycarbonate resin, an acrylic resin, a trimethylpentene resin or a polynorbornene resin, or a material including two or more of these resins can be used, and in particular, a silicone resin is preferably used. In addition, in covering of the alignment mark, it is preferable that, in order to form the light-transmissive resin 80 with a predetermined width and a predetermined thickness, a nanosized filler is added to the light-transmissive resin 80 to adjust the viscosity, and the light-transmissive resin 80 is applied. It is preferable that, after addition of the nano-filler to the light-transmissive resin 80, the light-transmissive resin 80 is applied onto the alignment marks 3*x* and 3*y* in a state where the light-transmissive resin 80 contains no foam by using, for example, a centrifugal stirring defoaming apparatus to maintain light-transmissivity of the light-transmissive resin 80.

Forming Reflective Resin

In the forming of the reflective resin, the reflective resin 70, which reflects light from the light emitting element 30, is formed on the periphery of the light emitting element 30 so as to expose at least a part of the surface of the light-transmissive resin 80.

In the case where the light-transmissive member 50 is disposed on the light emitting element 30, the reflective resin 70 is formed on the periphery of the light emitting element 30 and the light-transmissive member 50.

The forming of the reflective resin includes, for example, forming the reflective resin 70 to cover the alignment mark 3 and the light emitting element 30, and curing the reflective resin 70 (step A); and removing a portion of the cured reflective resin 70 to expose the upper surface of the light-transmissive resin 80 and the light emitting surface of the light emitting device, i.e. a surface of the light-transmissive member 50 (step B). Hereinafter, a case where the light-transmissive member 50 is disposed on the light transmitting element 30, and the forming of the reflective resin includes the step A and the step B will be described.

1. Forming Reflective Resin (Step A)

Figure 7D:
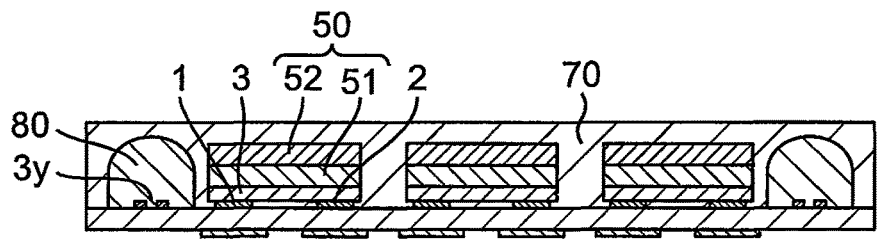
FIG. 7D is a schematic cross-sectional view where a reflective resin covering a light emitting element, a light-transmissive member and a light-transmissive resin is formed on a base member.

In the step A of forming the reflective resin, for example, the reflective resin 70 in a liquid form is applied onto the base member 10 to cover the light emitting element 30, the light-transmissive member 50, and the light-transmissive resin 80, so as to be charged on the periphery of the light emitting element 30 and the light-transmissive member 50, and is cured as shown in FIG. 7D. For example, a light-reflective material, e.g. titanium oxide is added to a light-transmissive resin such as a silicone resin, and then stirring is performed, after which the reflective resin 70 is charged in a syringe using, for example, a centrifugal defoaming charging machine. The reflective resin 70 charged in the syringe is applied to, for example, a base member which is set in a mold of a compression molding machine and on which the light emitting element 30 and the light-transmissive member 50 are mounted. When the reflective resin 70 is formed by compression molding, it is difficult to dispose the reflective resin 70 except for on the alignment marks 3. On the other hand, in the manufacturing method according to this embodiment, with the light-transmissive resin 80, it is possible to dispose the reflective resin 70 except for the alignment mark 3, so that, in the later-described cutting step, the alignment mark 3 can be accurately recognized with the light-transmissive resin 80. An example of forming the reflective resin 70 by compression molding is described above, but in the method of manufacturing according to this embodiment, the method for forming the reflective resin 70 is not limited to compression molding, and the reflective resin 70 may be formed using other method such as transfer molding. With the alignment marks 3 provided in the vicinity of each of the mounting regions 11, in the case of using transfer molding, the reflective resin 70 may be attached to the alignment mark 3 even if molding portion is defined by a mold. On the other hand, in the method of manufacturing according to this embodiment, with the light-transmissive resin 80, the reflective resin 70 can be formed without being attached to the alignment mark 3, and the alignment mark 3 can be more reliably recognized by covering the alignment mark 3 with the light-transmissive resin 80 in the cutting as described below.

2. Removing Reflective Resin (Step B)

In the step B of removing the reflective resin, the reflective resin 70 is removed to expose the upper surface of the light-transmissive resin 80 and the light emitting surface of the light emitting device.

Figure 7E:
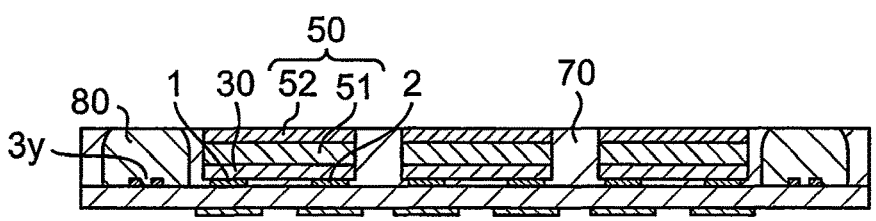
FIG. 7E is a schematic cross-sectional view where a reflective resin is partially removed to expose an upper surface of a light-transmissive member and a surface of a light-transmissive resin.

Specifically, the reflective resin 70 is removed starting from an upper surface thereof by grinding or blasting until the upper surface of the light transmissive member 50 (which will be the light emitting surface of the light emitting device) and a surface of the light-transmissive resin 80 as shown in FIG. 7E. In the manner described above, the reflective resin 70 which covers the lateral surfaces of the light emitting element 30 and the lateral surfaces of the light-transmissive member and in which the alignment mark 3 is exposed through the light-transmissive resin 80 is formed.

An example of removing the reflective resin 70 so as to expose both the upper surface of the light-transmissive resin 80 and the light emitting surface of the light emitting device is described above. In the description above, in the covering of the alignment mark, the light-transmissive resin 80 is disposed such that the upper surface of the light-transmissive resin 80 is in the same plane with or located above the light emitting surface of the light emitting device. In addition, the light-transmissive resin 80 is disposed such that the alignment mark 3 is located inward of the outer periphery of the exposed surface of the light-transmissive resin 80 in a top view after the removing of the reflective resin. Accordingly, in the cutting, which will be described below, the position of the alignment mark 3 can be accurately and more reliably recognized.

Further, in the manufacturing method according to the first embodiment, the upper surface of the light-transmissive resin 80 and the light transmitting surface of the light transmitting device may be exposed in different steps. When the upper surface of the light-transmissive resin 80 and the light emitting surface of the light emitting device are exposed in different steps, the upper surface of the light-transmissive resin 80 may be above or below the light emitting surface of the light emitting device. In addition, a surface of the light-transmissive resin 80, which is to be exposed, is exposed such that the alignment marks 3$x$ and 3$y$ are located inward of the outer periphery of the exposed surface of the light-transmissive resin 80 in top view.

Cutting

In the cutting, the positions of the alignment marks 3$x$ and 3$y$ are recognized through the light-transmissive resin 80, a surface of which is exposed, and the reflective resin 70 and the base member 10 at a position between unit mounting regions 11$u$ are cut with reference to the recognized alignment marks 3$x$ and 3$y$ to perform singulation into individual light emitting devices.

Figure 7F:
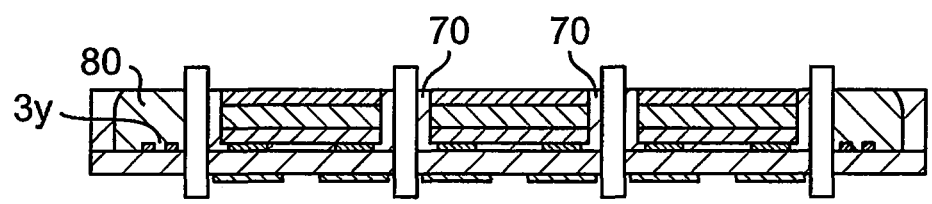
FIG. 7F is a schematic cross-sectional view showing a state in which the base member and a reflective resin are cut by a cutting blade.
Figure 7G:
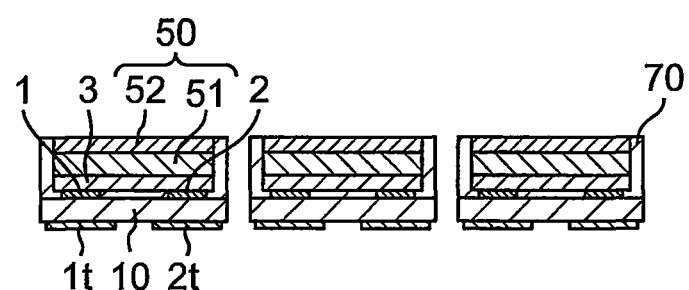
FIG. 7G is a schematic cross-sectional view where division into individual light emitting devices is performed.

In the cutting, the base member 10 and the reflective resin 70 are cut by a cutting blade so as to form the reflective resin 70 covering the lateral surfaces of the light-transmissive member 50 and the lateral surfaces of the light emitting element 30 with a predetermined width as shown in FIG. 7F. At the time of cutting the base member 10 and the reflective resin 70, the cutting positions is set by positioning the cutting blade with reference to the alignment mark. With the alignment mark 3 covered with the light-transmissive resin 80 and the light-transmissive resin 80 having a surface that is exposed, the alignment mark 3 can be reliably recognized to accurately set the cutting position. Accordingly, it is possible to form the reflective resin 70 covering the lateral surfaces of the light-transmissive member 50 and the lateral surfaces of the light emitting element 30 with a predetermined width. With the alignment mark 3$x$ formed in the vicinity of each corner of the mounting region 11 and having the longitudinal direction coinciding with the X direction, recognition of a pair of alignment marks 3$x$ adjacent in the X direction can be used for positioning when the cutting blade is moved in the X direction and cutting is performed. Further, with the alignment mark 3$y$ formed with the longitudinal direction coinciding with the Y direction, recognition of a pair of alignment marks 3$x$ adjacent in the Y direction can be used for positioning when the cutting blade is moved in the Y direction and cutting is performed.

Even further, with the alignment mark 3 is provided in the vicinity of a corner of the mounting region 11, the distance between a pair of adjacent alignment marks 3 is reduced, so that an error occurring in recognition of the alignment mark 3 can be reduced to improve the accuracy of the cutting position.

In addition, when the alignment marks are formed with high accuracy with respect to the first projection 1$a$ and the second projection 2$a$ as shown in the modified example below, the light emitting element 30 can be mounted accurately in position with respect to the first projection 1$a$ and the second projection 2$a$ due to a self-alignment effect, and cutting can be performed with reference to the alignment marks 3 formed accurately in position with respect to the first projection 1$a$ and the second projection 2$a$. Accordingly, it is possible to form the reflective resin 70 covering the lateral surfaces of the light-transmissive member 50 and the lateral surfaces of the light emitting element 30 with a predetermined width.

The cutting may be carried out by, for example, a blade dicing apparatus without spraying water or while water is sprayed. When cutting is performed while water is sprayed, it is preferable that the light-transmissive member 50 includes the second light-transmissive member 52 containing substantially no wavelength conversion substance 51$b$ at the light emitting surface side, and accordingly, discoloration of the wavelength conversion substance 51$b$ contained in the first light-transmissive member 51 can be prevented.

With the method of manufacturing a light emitting device according to the first embodiment described above, the reflective resin 70 covering the lateral surfaces of the light-transmissive member 50 and the lateral surfaces of the light emitting element 30 with a predetermined width can be formed while a variation in thickness thereof can be reduced. Accordingly, it is not necessary to form the reflective resin 70 with an excessively large thickness with consideration on a variation in accuracy of the cutting position, and thus a small-sized light emitting device can be manufactured.

Subsequently, a manner of providing of the base member that allows for forming the alignment marks 3x and 3y with high accuracy in position with respect to the first projection 1a and the second projection 2a, which is preferable, will be described.

In this manner of providing the base member, the alignment marks 3x and 3y are formed by a pattern having a recess and a periphery surrounded by the wiring electrode 12 and exposing the surface of the base member 10 therefrom, and an exposure of the photolithography in formation of the alignment marks 3x and 3y and an exposure of the photolithography in formation of the first projection 1a and the second projection 2a that define the mounting position of the light emitting element 30 are performed at once.

Specifically, the base member 10 is provided in the manner as described below.

1. Forming Wiring Metal Film

First, the wiring metal film 151 for forming the first lower electrode 1b and the second lower electrode 2b is formed on the upper surface of the substrate 15 in each unit mounting region 11u. The first terminal electrode 1t and the second terminal electrode 2t are disposed on the lower surface of the substrate 15, and connected to the first lower electrode 1b and the second lower electrode 2b, respectively, by the connection electrodes 1c and 2c formed in a through-hole formed in the substrate 15, but illustrations of these terminal electrodes are omitted in FIGS. 8A to 8I which will be described below.

Figure 8A:
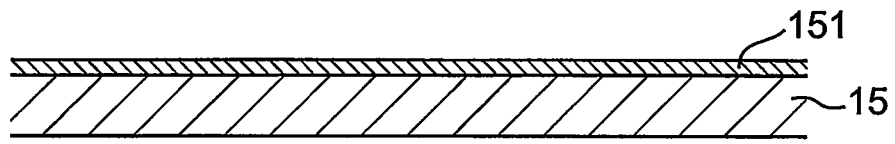
FIG. 8A is a schematic cross-sectional view where a wiring metal film is formed on a substrate in a base member providing step in a method of manufacturing according to the first embodiment.

The wiring metal film 151 is formed over the whole upper surface of the substrate 15 including the alignment-mark formation region 13 as shown in FIG. 8A. The wiring metal film 151 is formed with a predetermined thickness by, for example, forming an electrolytic copper-plated layer on an electroless copper-plated layer.

2. Performing First Photolithography (a) Forming First Resist

Figure 8B:
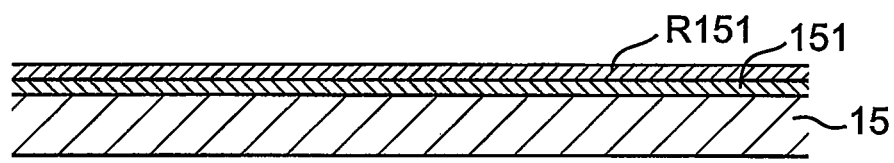
FIG. 8B is a schematic cross-sectional view where a first resist is formed on a wiring metal film in a base member providing step in the method of manufacturing according to the first embodiment.

Next, for example, a dry-film resist, which is adapted to be cured at an exposed portion thereof, is applied onto an entirety of the wiring metal film 151 to form the first resist R151 as shown in FIG. 8B.

(b) Performing First Exposure Step

Next, the first resist R151 formed on portions that will be the first lower electrode 1b and the second lower electrode 2b in each unit mounting region 11u is irradiated with light to cure the resist. At the time of curing the first resist R151, the first resist R151 formed on at least the wiring metal film surrounding the unit alignment-mark formation regions 13a and 13b is also irradiated with light to be cured.

(c) Performing First Development

Figure 8C:
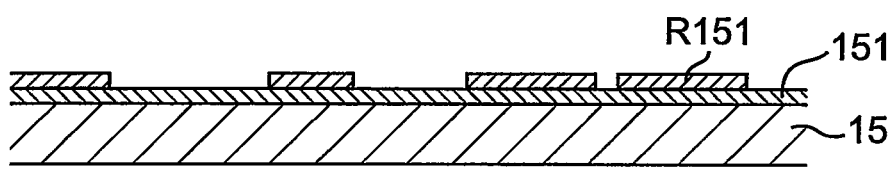
FIG. 8C is a schematic cross-sectional view where a first resist is exposed and developed in a base member providing step in the method of manufacturing according to the first embodiment.

After the first resist R151 is cured, the uncured first resist R151 is removed as shown in FIG. 8C.

(d) Removing Wiring Metal Film

Figure 8D:
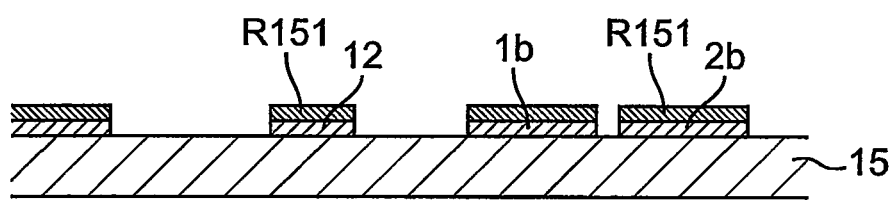
FIG. 8D is a schematic cross-sectional view where a wiring metal film is etched with a developed first resist as a mask in a base member providing step in the method of manufacturing according to the first embodiment.

Next, as shown in FIG. 8D, the wiring metal film 151 is etched using the pattern-formed first resist R151.

Figure 8E:
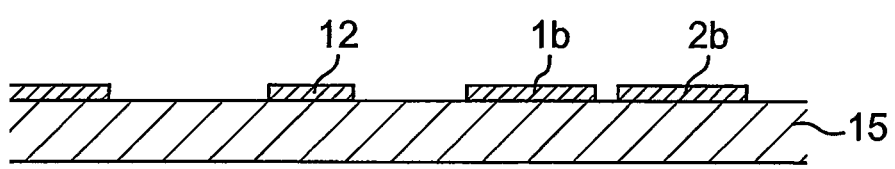
FIG. 8E is a schematic cross-sectional view where the first resist is removed after a wiring metal film is etched in a base member providing step in the method of manufacturing according to the first embodiment.

In the manner described above, the first lower electrode 1b and the second lower electrode 2b of each unit mounting region 11u are formed, and the wiring electrode 12 is formed surrounding each of the unit alignment-mark formation regions 13a and 13b as shown in FIG. 8E.

3. Forming Projection Metal Film

Figure 8F:
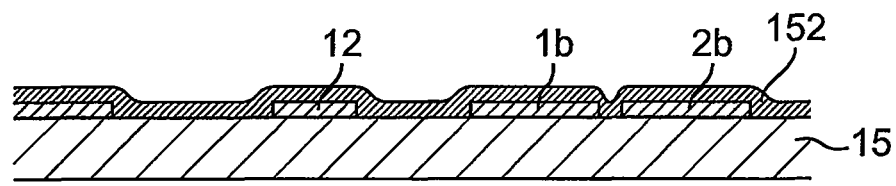
FIG. 8F is a schematic cross-sectional view where a projection metal film is formed on a substrate including a first lower electrode, a second lower electrode and a wiring electrode in a base member providing step in method of manufacturing according to the first embodiment.

Next, as shown in FIG. 8F, the projection metal film 152 for forming the first projection 1a, the second projection 2a, and an electrode frame that surrounds the alignment mark 3 is formed over an entirety of the upper surface of the substrate 15. On portions of the substrate 15 on which the wiring electrode 12 is not formed, the projection metal film 152 is formed directly on a surface of the substrate 15. On portions of the substrate 15 on which the wiring electrode 12 including the first lower electrode 1b and the second lower electrode 2b is formed, the projection metal film 152 is formed on the first lower electrode 1b, the second lower electrode 2b and the wiring electrode 12. The projection metal film 152 is formed to have a predetermined thickness by, for example, electrolytic-plating copper on an electroless copper-plated layer.

4. Performing Second Photolithography Step (a) Forming Second Resist

Figure 8G:
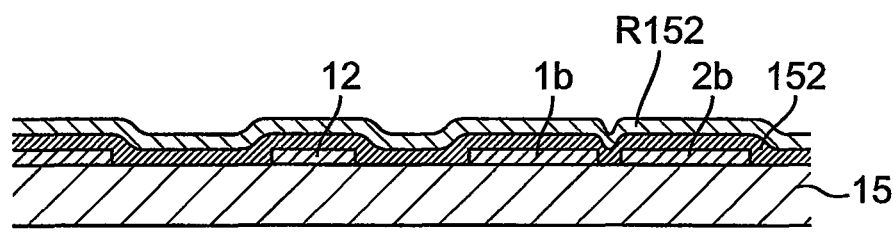
FIG. 8G is a schematic cross-sectional view where a second resist is formed on a projection metal film in a base member providing step in the method of manufacturing according to the first embodiment.

Next, as shown in FIG. 8G, a second resist R152 is applied onto the whole projection metal film 152. For the second resist R152, for example, a dry-film resist, which is adapted to be cured at an exposed portion thereof, can be used.

(b) Performing Second Exposure

Next, for example, the second resist R152 on the first projection 1a, the second projection 2a, and the electrode frame 3a surrounding the alignment mark 3 is irradiated with light to cure portions corresponding to the first projection 1a, the second projection 2a and the electrode frame 3a.

In the irradiating of the second resist R152 with light, for example, the second resist R152 for formation of projections and the second resist R152 for formation of alignment marks are irradiated in the same exposure. More specifically, with reference to pattern data including position information of the first projection 1a, the second projection 2a, and the electrode frame 3a surrounding the alignment marks 3, the first projection 1a, the second projection 2a and the electrode frame 3a are irradiated with a series of continuous light, for example, without resetting the irradiation position between irradiation to the pattern of the first projection 1a and irradiation to the pattern of the second projection 2a or between irradiation to the pattern of the first projection 1a and/or the second projection 2a and irradiation to the pattern of the electrode frame 3a. Accordingly, the electrode frame 3a surrounding the alignment mark 3 can be formed with a high accuracy in position with respect to the first projection 1a and the second projection 2a. In the description above, an example of directly irradiating the second resist R152 with light has been shown, but exposure may be performed through a photomask in which patterns corresponding to the first projection 1a, the second projection 2a and the electrode frame 3a are integrally formed.

(c) Performing Second Development

Figure 8H:
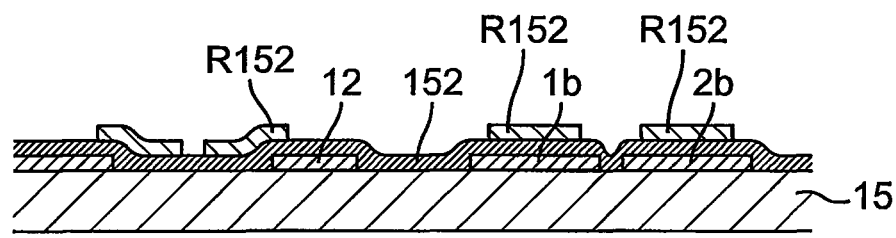
FIG. 8H is a schematic cross-sectional view where a second resist is exposed and developed in a base member providing step in the method of manufacturing according to the embodiment.

Next, the uncured second resist R152 is removed to form the second resist R152 with a pattern corresponding to the first projection 1a, the second projection 2a and the electrode frame 3a as shown in FIG. 8H.

(d) Removing Projection Metal Film

Figure 8I:
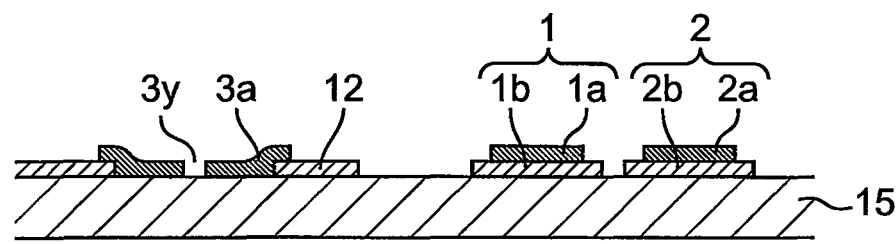
FIG. 8I is a schematic cross-sectional view where a second resist is removed by etching a projection metal film with the second resist as a mask in a base member providing step in the method of manufacturing according to the embodiment.

Except for portions provided with the second resist R152, the projection metal film 152 is removed by etching to form the first projection 1a, the second projection 2a and the electrode frame 3a as shown in FIG. 8I.

In the formation of the first projection 1a, the second projection 2a and the electrode frame 3a in the manner described above, irradiation for the pattern of the first projection 1a, irradiation for the pattern of the second projection 2a and irradiation for the electrode frame 3a are formed by irradiation with a series of continuous light to form the second resist pattern, the alignment marks can be formed with high accuracy in position with respect to the first projection 1a and the second projection 2a. In the present method of manufacturing, in the case where exposure is performed through a photomask in which patterns corresponding to the first projection 1a, the second projection 2a and the electrode frame 3a, similarly, the alignment mark 3 can be formed with high accuracy in position with respect to the first projection 1a and the second projection 2a.

In the present specification, forming the alignment mark 3 and the wiring electrode 12 by forming a patterned resist with the same exposure step and performing development with the use of the patterned resist is referred to as "forming the alignment mark 3 the wiring electrode 12 simultaneously".

In the description above, the method of manufacturing a light emitting device is illustrated with an example in which portions where a surface of the base member 10 is exposed and each surrounded by an electrode frame serve as the alignment marks 3. Meanwhile, the method of manufacturing a light emitting device according to the embodiment is not limited to such configuration, and for example, a metal layer formed simultaneously with the first projection 1a and the second projection 2a may be formed to have protrusions in regions where the surface of the base member 10 is exposed, and the protruded portion of the used as an alignment mark. Even in the case of using the protruded portions of the metal layer as alignment marks, the alignment marks can be formed with high accuracy in position with respect to the first projection 1a and the second projection 2a by forming the protruding portions of the metal layer as the alignment mark is formed simultaneously with the first projection 1a and the second protrusion 2a.

DENOTATION OF REFERENCE NUMERALS

1 First land electrode
1a First projection
1b First lower electrode
1t First terminal electrode
1c, 2c Connection electrode
2 Second land electrode
2a Second projection
2b Second lower electrode
2t Second terminal electrode
3a Electrode frame
3, 3x, 3y Alignment mark
10 Base member
11 Mounting region
11u Unit mounting region
12 Wiring electrode
13 Alignment-mark formation region
13a, 13b Unit alignment-mark formation region
15 Substrate
20 Electrically conductive bonding member
30 Light emitting element
31 p-side electrode
32 n-side electrode
33 Semiconductor layered structure
34 Element substrate
40 Light guide member
50 Light-transmissive member
51 First light-transmissive member
51a Base material
51b wavelength conversion substance
52 Second light-transmissive member
70 Reflective resin
80 Light-transmissive resin
100 Light emitting device
101 Singulated base member

What is claimed is:

1. A method of manufacturing a light emitting device in which a plurality of light emitting devices are formed collectively and then separated into individual light emitting devices, wherein each light emitting device includes a light emitting element, the method comprising:
    a base member providing step of providing a base member including:
        a wiring electrode to be connected to the light emitting elements, and an
        alignment mark,
        wherein the wiring electrode and the alignment mark are disposed on an upper surface of the base member;
    a mounting step of mounting each of the light emitting elements at a predetermined position;
    an alignment mark covering step of covering the alignment mark with a light-transmissive resin;
    a reflective resin forming step of forming a reflective resin surrounding the light emitting element so as to expose at least a part of a surface of the light-transmissive resin, the reflective resin reflecting light from the light emitting element; and
    a cutting step of recognizing the alignment mark through the exposed surface of the light-transmissive resin, and cutting the reflective resin and the base member with reference to the alignment mark to perform singulation into individual light emitting devices,
    wherein the reflective resin forming step comprises:
    forming the reflective resin to cover the alignment mark and the light emitting element, and curing the reflective resin; and
    removing the cured reflective resin to expose the upper surface of the light-transmissive resin and the light emitting surface of the light emitting device.

2. The method of manufacturing a light emitting device according to claim 1, wherein the base member providing step comprises:
    providing the base member having a rectangular mounting region in which a plurality of the light emitting elements is mounted; and
    providing the alignment mark outside the mounting region in the vicinity of a corner of the mounting region.

3. The method of manufacturing a light emitting device according to claim 2, wherein the base member providing step comprises:
    providing the base member having a plurality of the mounting regions, each of the plurality of mounting regions having a substantially rectangular shape, the plurality of mounting regions being provided such that single sides of the rectangular shapes are located substantially on a single straight line; and
    providing a plurality of the alignment marks along the single straight line.

4. The method of manufacturing a light emitting device according to claim 1, wherein the base member providing step comprises:
    forming the alignment mark simultaneously with the wiring electrode.

5. The method of manufacturing a light emitting device according to claim 1, wherein the base member providing step comprises:
    forming the alignment mark in a region surrounded by the wiring electrode.

6. The method of manufacturing a light emitting device according to claim 1, wherein the alignment mark covering step comprises:

disposing the light-transmissive resin such that an upper surface of the light-transmissive resin is located above a light transmitting surface of the light transmitting device.

7. The method of manufacturing a light emitting device according to claim 1, wherein the alignment mark covering step comprises:
disposing the light-transmissive resin in such a manner that the alignment mark is located inward of the outer periphery of an exposed surface of the light-transmissive resin in top view.

8. The method of manufacturing a light emitting device according to claim 1, wherein the reflective resin forming step comprises:
removing the reflective resin to simultaneously expose the upper surface of the light-transmissive resin and the light emitting surface of the light emitting device.

9. The method of manufacturing a light emitting device according to claim 1, wherein the reflective resin forming step comprises:
forming the reflective resin by compression molding.

10. The method manufacturing a light emitting device according to claim 1, wherein the method comprises a bonding step of bonding a light-transmissive member onto the mounted light emitting element before the reflective resin forming step.

11. The method of manufacturing a light emitting device according to claim 10, wherein the method comprises a processing step of processing each light-transmissive member into a predetermined shape by grinding lateral surfaces of each light-transmissive member after disposing the light-transmissive member on the light emitting element.

12. The method of manufacturing a light emitting device according to claim 10, wherein
the light-transmissive member includes a first light-transmissive member containing a wavelength conversion substance, and a second light-transmissive member which is disposed on the first light-transmissive member, and containing substantially no wavelength conversion substance,
the upper surface of the light-transmissive member is covered with the reflective resin, and
then, a portion of the reflective resin provided on the light-transmissive member and a portion of the second light-transmissive member are removed.

13. The method of manufacturing a light emitting device according to claim 1, wherein the reflective resin is formed to cover the lateral surface of the light-transmissive member together with the light emitting element.

* * * * *